(12) United States Patent
Too et al.

(10) Patent No.: US 8,987,116 B2
(45) Date of Patent: Mar. 24, 2015

(54) PRODUCTION OF ELECTRONIC SWITCHING DEVICES

(75) Inventors: Patrick Too, Cambridge (GB); Michael Banach, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 53 days.

(21) Appl. No.: 13/701,981

(22) PCT Filed: Jun. 3, 2011

(86) PCT No.: PCT/EP2011/059223
§ 371 (c)(1),
(2), (4) Date: Feb. 15, 2013

(87) PCT Pub. No.: WO2011/151460
PCT Pub. Date: Dec. 8, 2011

(65) Prior Publication Data
US 2013/0157443 A1    Jun. 20, 2013

(30) Foreign Application Priority Data

Jun. 4, 2010 (GB) .................................. 1009406.8

(51) Int. Cl.
| | |
|---|---|
| *H01L 21/20* | (2006.01) |
| *H01L 21/02* | (2006.01) |
| *H01L 51/00* | (2006.01) |
| *H01L 51/05* | (2006.01) |

(52) U.S. Cl.
CPC ...... *H01L 21/02617* (2013.01); *H01L 51/0004* (2013.01); *H01L 21/0226* (2013.01); *H01L 51/0541* (2013.01); *H01L 51/0545* (2013.01)
USPC ........................................................ 438/478

(58) Field of Classification Search
None
See application file for complete search history.

(56) References Cited

U.S. PATENT DOCUMENTS

| | | | |
|---|---|---|---|
| 5,711,818 A | 1/1998 | Jain | |
| 7,345,303 B2* | 3/2008 | Birau et al. ..................... | 257/40 |
| 2002/0003397 A1 | 1/2002 | Yamazaki | |
| 2006/0116047 A1 | 6/2006 | Bae et al. | |
| 2006/0207457 A1* | 9/2006 | Rogojevic et al. ............ | 101/454 |
| 2006/0216853 A1* | 9/2006 | Nomoto ......................... | 438/99 |
| 2006/0244369 A1 | 11/2006 | Eiichi | |
| 2009/0124090 A1 | 5/2009 | Stone | |
| 2009/0186440 A1 | 7/2009 | Duggal et al. | |

FOREIGN PATENT DOCUMENTS

| | | |
|---|---|---|
| DE | 10 2004 046 428 A1 | 6/2006 |
| EP | 1 267 394 A2 | 12/2002 |

(Continued)

OTHER PUBLICATIONS

British Search Report for GB1009406.8 dated Oct. 3, 2011.

(Continued)

*Primary Examiner* — Scott B Geyer
(74) *Attorney, Agent, or Firm* — Sughrue Mion, PLLC

(57) ABSTRACT

A technique of producing one or more electronic switching devices, each switching device comprising a semiconductor channel between two electrodes, and a dielectric element separating said semiconductor channel from a switching electrode, the method comprising: depositing onto a substrate a layer of material for at least partly forming said semiconductor channel or said dielectric element of said one or more switching devices by transferring said material onto said substrate from a rotating first roller.

11 Claims, 5 Drawing Sheets

(56) References Cited

FOREIGN PATENT DOCUMENTS

EP 1 615 275 A2 1/2006
WO 2006/116263 A1 11/2006

OTHER PUBLICATIONS

International Search Report for PCT/EP2011/059223 dated Jul. 27, 2011.

* cited by examiner

PRODUCTION OF ELECTRONIC SWITCHING DEVICES

CROSS REFERENCE TO RELATED APPLICATIONS

This application is a National Stage of International Application No. PCT/EP2011/059223, filed on Jun. 3, 2011, which claims priority from British Patent Application No. 1009406.8, filed on Jun. 4, 2010, the contents of all of which are incorporated herein by reference in their entirety.

The present invention relates to the deposition of electronically functional organic layers of electronic switching devices. In one embodiment, it relates to the formation of a semiconductor channel and/or a gate dielectric layer in the production of an organic field effect transistor product.

Many organic electronic devices comprise an array of organic field effect transistors. For example, pixellated display devices typically comprise an active matrix array of organic thin-film field effect transistors (TFTs) for independent controlling the state of each pixel. Each TFT comprises an organic semiconductor channel between a pair of source and drain electrodes, and a gate electrode for controlling the conductivity of the semiconductor channel via an organic gate dielectric element.

The production of large area display devices of the kind mentioned above typically comprises forming a continuous layer of an organic semiconductor material to form the semiconductor channels of the whole array of TFTs, and/or forming a continuous layer of an organic dielectric material to form the gate dielectric elements of the whole array of TFTs. The formation of such continuous organic layers is conventionally done by spin-coating, slit-coating, spray-coating, dip-coating or screen printing.

It is an aim of the present invention to provide a new technique by which a continuous layer of organic semiconductor material and/or organic dielectric material having the necessary properties for forming these electronically functionally elements of electronic switching devices can be consistently and reliably formed.

The present invention provides a method of producing one or more electronic switching devices, each switching device comprising a semiconductor channel between two electrodes, and a dielectric element separating said semiconductor channel from a switching electrode, the method comprising: depositing onto a substrate a layer of material for at least partly forming said semiconductor channel or said dielectric element of said one or more switching devices by transferring said material onto said substrate from a rotating first roller.

In one embodiment, the layer deposited on the substrate exhibits a thickness non-uniformity of less than about 7%.

In one embodiment, the method further comprises selectively depositing said material onto selected regions of said substrate to form a patterned layer in a single rotation of said first roller.

In one embodiment, the thickness non-uniformity of said patterned layer over the combined area of said patterned layer is less than about 7%.

In one embodiment, the substrate defines a plurality of patterned conductive layers in respective selected regions of the substrate, and said patterned layer of material provides a respective layer of said material over each of said patterned conductive layers.

In one embodiment, each of said patterned conductive layers defines a respective array of source-drain electrode pairs for a respective array of transistors, or a respective array of gate lines for a respective array of transistors.

In one embodiment, the method further comprises applying said material to a second roller and transferring said material from said second roller to said first roller whilst rotating the first and second rollers, and controlling the tangential speed of the second roller such that the rear edge of said material transferred from said first roller onto the substrate has a thickness substantially no greater than the average thickness of the remainder of the layer deposited onto the substrate.

In one embodiment, the method further comprises transferring said material from said second roller to said first roller whilst rotating the second roller at a greater tangential speed than said first roller.

In one embodiment, the tangential speed of the second roller is between about 2% and about 5% greater than the tangential speed of the first roller.

In one embodiment, the surface of the first roller defines a plurality of parallel grooves for receiving and holding said material; and further comprising cleaning the first roller by passing one or more cleaning solvents over the first roller in a direction perpendicular to said parallel grooves.

An embodiment of the present invention shall be described in detail hereunder, by way of example only, with reference to the accompanying drawings in which:

FIGS. 1(a) to FIGS. 1(d) illustrate two kinds of TFT architectures in which a continuous layer of semiconductor material forms the semiconductor channels of an array of TFTs and a continuous layer of dielectric material forms the gate dielectric elements of an array of TFTs;

Figure 1A:
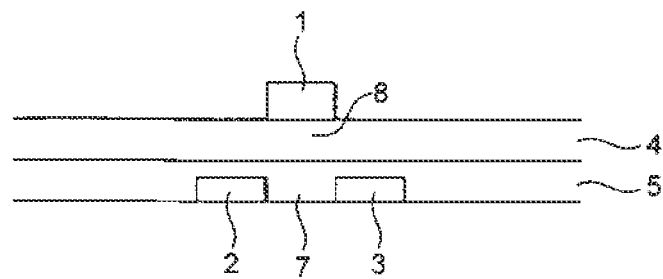
Figure 1B:
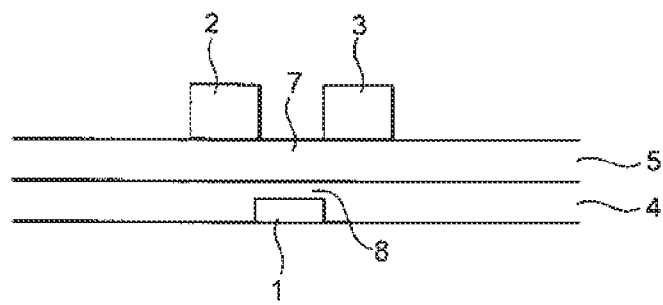
Figure 1C:
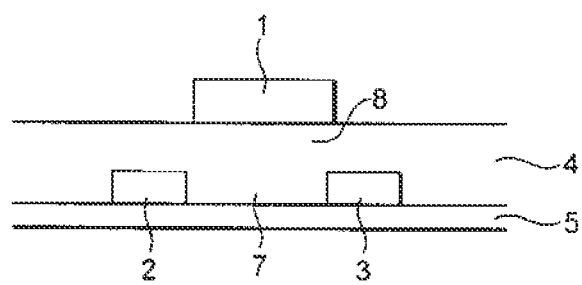
Figure 1D:
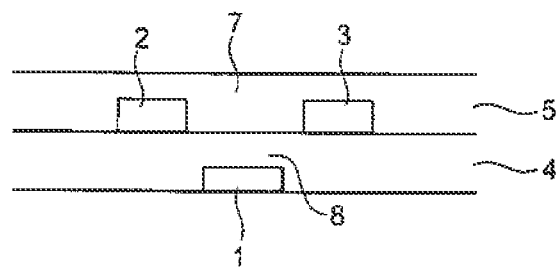

FIGS. 1(a) to 1(d) show two examples of TFT architectures: a top-gate structure and a bottom-gate structure. In both architectures, a TFT comprises source and drain electrodes 2, 3 connected by a semiconductor channel 7; and a gate electrode 1 separated from the semiconductor channel via a gate dielectric element 8. The conductivity of the semiconductor channel 7 can be controlled by adjusting the bias applied to the gate electrode 1. For example, the semiconductor channel can be switched between essentially on (conducting) and off (non-conducting) states by switching the bias applied to the gate electrode between two levels. In each of the architectures, the semiconductor channel 7 and the dielectric element 8 of the TFT shown (and also other TFTs in the same array (not shown) is formed by a continuous layer of semiconductor material 5 and a continuous layer of dielectric material 4, respectively.

Figure 2:
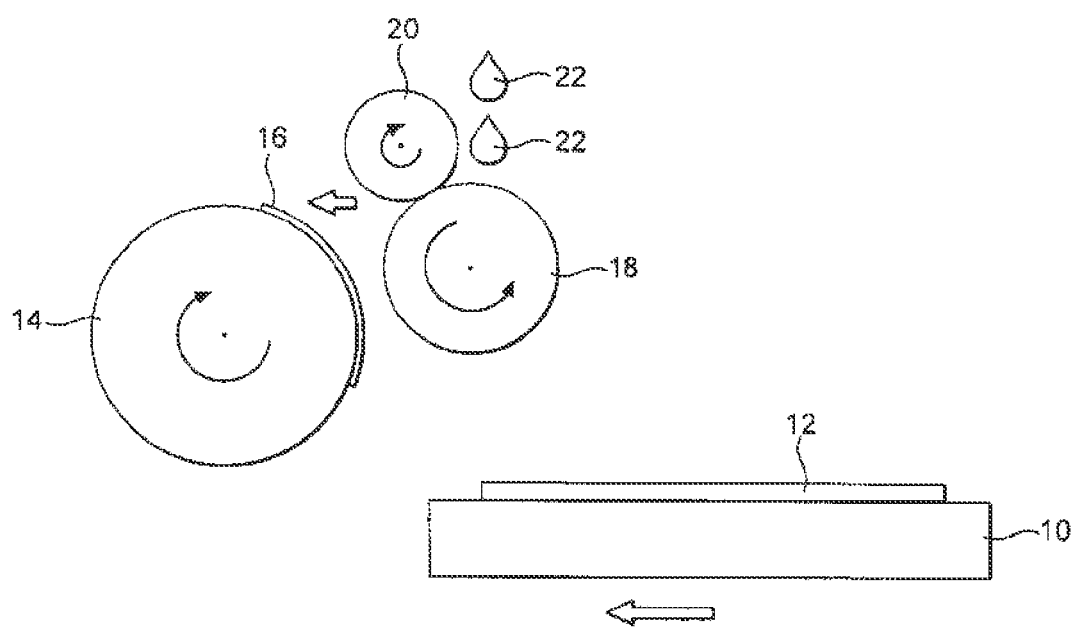
FIG. 2 illustrates apparatus for use in a method according to an embodiment of the present invention.
Figure 3:
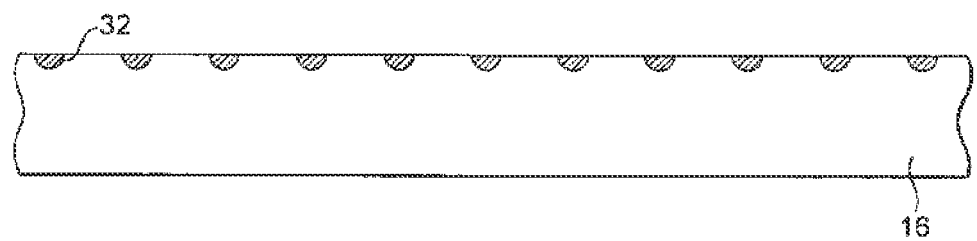
FIG. 3 illustrates in more detail a mat used in the apparatus shown in FIG. 2.

In this embodiment of the invention, the layers 4, 5 of semiconductor material and dielectric material are each formed of an organic polymeric material, and are deposited using the kind of apparatus shown in FIGS. 2 and 3.

Figure 6:
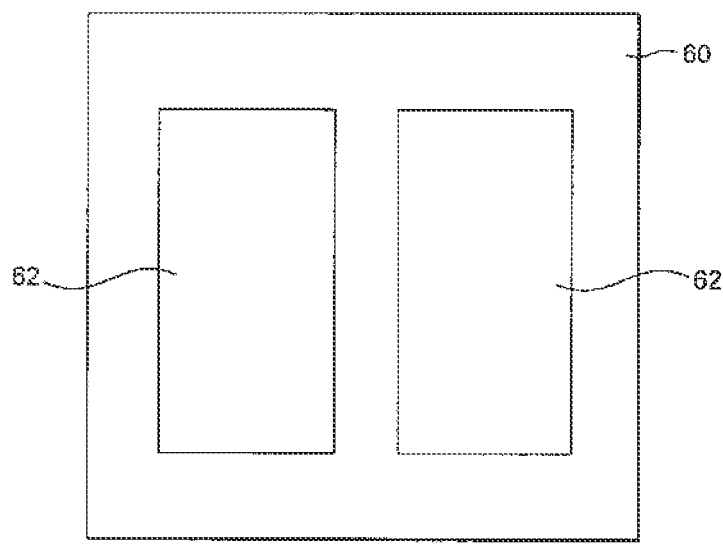
FIG. 6 illustrates accordance substrate used in an embodiment of the present invention.

The substrate 12 onto which a continuous layer of dielectric and/or semiconductor material is to be formed is mounted on a stage 10 which is itself mounted for linear movement in the direction shown by the arrow in FIG. 2. With reference to FIG. 6, the substrate 12 comprises a continuous sheet 60 of device substrate material supported on a rigid glass carrier. The device substrate material 60 provides a plurality of device substrates for the same number of display device products. The plurality of device substrates are cut from the continuous sheet of device substrate material at a later stage of the production process.

The regions of the device substrate material sheet 60 that later form the device substrates are designated by reference numerals 62 in FIG. 6. FIG. 6 shows a simple example where the device substrate material sheet provides two device substrates, but larger numbers are also possible and beneficial from the point of view of achieving an efficient production process. The continuous sheet of device substrate material 60 has already been subject to at least the following steps: the formation of a planarisation layer (not shown), and the formation in the device substrate regions 62 of a patterned metal layer (not shown) that defines the bottom conductive layer of the respective array of TFTs. The bottom conductive layer could be a layer that defines the source-drain electrode pairs and interconnect/signal lines (in the case of an array of top-gate TFTs of the kind shown in FIG. 1(*a*)) or a layer that defines an array of gate lines (in the case of an array of bottom-gate TFTs of the kind shown in FIG. 1(*b*)).

In this embodiment, a TFT array is formed on each device substrate region 62 to form a backplane for a display device, and a respective pre-prepared frontplane including a display medium is laminated to each completed backplane. The above-mentioned cutting of the device substrate material takes place after lamination of the front planes to the backplanes.

Figure 7:
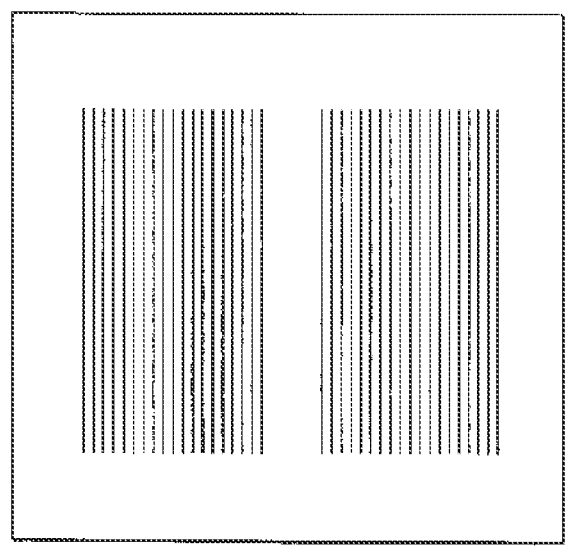
FIG. 7 illustrates a mat for depositing a patterned layer of material in accordance with an embodiment of the present invention.

A cylinder roller 14 is provided on a surface thereof with a mat 16 configured to receive and hold in microrecesses liquid 22 to be deposited onto the substrate 12. With reference to FIG. 7, microrecesses are only provided at those regions of the mat corresponding to the device substrate regions 62 mentioned above, so that only these selected sections of the mat hold liquid 22 to be deposited onto the substrate 12, and so that a set of layers are formed on the device substrate regions 62 substantially without any deposition of the liquid 22 on the areas of the substrate 12 between the device substrate regions 62. The set of layers that is so deposited is referred to below as a patterned layer, and this patterned layer is achieved without having to use a mask.

The liquid 22 comprises a solution of the semiconductor or dielectric material in a solvent. The microrecesses 32 can, for example, take the form of an array of parallel microgrooves 32 or an array of micropores. With said microrecesses loaded with liquid 22 for deposition onto the substrate, cylinder roller 14 is rotated about a stationary axis as the stage is moved in the direction shown by the arrow in FIG. 2, such that the mat 16 is rolled under pressure over the surface of the substrate 12. This action forces the liquid 22 held in the microrecesses to be expelled from the microrecesses onto the surface of the substrate 12 to form continuous layers of the liquid on the device substrate region 62 of the substrate 12. The tangential speed of cylinder roller 14 during this process is the same as the linear speed of the stage 10 on which the substrate 12 is mounted. The stage 10 is then lowered by a small amount and moved back in the opposite direction to the starting position, in preparation for the deposition of a second layer of the other of the semiconductor and dielectric materials.

One of the challenges of achieving the sufficient level of print quality for forming semiconductor and gate dielectric layers of a transistor by this kind of technique is avoiding dried particles of the semiconductor or gate dielectric material forming on the mat. The inventors have found that the use of (i) a solvent having a boiling point of no less than about 100° C. and a vapour pressure greater than 17 mmHg at 20° C., or (ii) a solvent having a boiling point of greater than 195° C. (and any value of vapour pressure), can effectively avoid the formation of such dried particles on the mat.

Examples of suitable solvents having these properties include:

PhenylCycloHexane also known as CycloHexylBenzene (CAS#827-52-1)
1,3-Diisopropenylbenzene (CAS#3748-13-8)
Tetralin (CAS#119-64-2)
Butyl Phenyl Ether (CAS#1126-79-0)
N-Methyl-2-pyrrolidone (CAS#872-50-4)
2-(2-Butoxyethoxy)Ethyl Acetate (CAS#124-17-4)
Ethylene Glycol Butyl Ether (CAS#111-76-2)
Diethylene Glycol Monoethyl Ether Acetate (CAS#112-15-2)
2-(2-Methoxyethoxy)Ethyl Acetate (CAS#629-38-9)
Hexanol (CAS#111-27-3)
Octanol
FC-70
Triethylene glycol dimethyl ether (CAS#112-49-2)
2-Ethyl-1-Hexanol (CAS#104-76-7)

The CAS numbers are Chemical Abstract Services registry numbers.

It has been found that the thickness uniformity of the patterned layer formed on the substrate 12 depends on the extent to which the mat 16 resists swelling by the solvent of the liquid 22. It has been found that it is possible to achieve a thickness non-uniformity of less than 7%, more particularly less than 5%, by using a solvent where the amount of swelling is no more than 30%, where the amount of swelling is defined by the percentage weight gain after soaking the mat for 24 hours in the solvent. The thickness non-uniformity of the deposited patterned layer is defined as the size of the variation in thickness of the deposited patterned layer after drying (e.g. the difference between the average thickness of the dried patterned layer and the minimum or maximum thickness of the dried patterned layer) expressed as a percentage of the average thickness of the deposited patterned layer.

The average thickness and the minimum or maximum thickness of the deposited material after drying is comprising an equal number of thickness measurements for each of the device substrate regions 62, at uniformly spaced points of the respective device substrate regions 62.

This good level of uniformity is achieved in this embodiment using a mat made of a material that is compatible with the solvent used to deposit the semiconductor or dielectric material, i.e. a solvent that passes the swelling test described above.

Examples of solvents for organic semiconductor or dielectric materials in this embodiment include: diethylene glycol monoethyl ether acetate, 1-methyl-2-pyrrolidinone, alcohol based solvents, aromatic hydrocarbons and fluorinated based solvents (such as fluorocarbon solvents).

Figure 4:
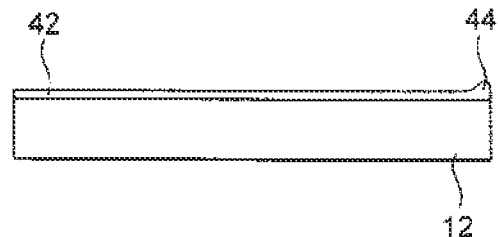
FIG. 4 illustrates a problem solved by a method according to an embodiment of the present invention.

Returning to the apparatus illustrated in FIG. 2, the liquid 22 is loaded onto the mat using a second cylinder roller 18. A layer of the liquid 22 is formed on the surface of the second cylinder roller 18, and the liquid 22 is transferred from the second cylinder roller to the mat 16 by pushing the second cylinder roller 18 against the mat 16 and rotating both the cylinder rollers 16 and 18. It has been found that relatively small differences in the relative tangential speeds of the two cylinder rollers 16 and 18 during this transfer process can have a significant effect on the thickness uniformity of the layer deposited onto the substrate. In particular, it has been found that rotating the two rollers 16 and 18 at the same tangential speed can produce what can be called a lip effect or edge effect at the rear edge of the resulting patterned layer on the substrate 12, i.e. the part of the patterned layer that is the last to be deposited on the substrate 12 as the roller 14 moves over the substrate 12. This lip effect or edge effect is illustrated in FIG. 4. The thickness of a rear edge portion 44 of the patterned layer 42 is greater than the average thickness of the remainder of the patterned layer 42. As mentioned above, the rear edge portion of the patterned layer is the portion of the patterned layer 42 that is the last to be transferred from the cylinder roller 14 to the substrate 12 as the mat 16 is rolled over the substrate 12.

In the embodiment of the present invention, it has been found that excess thickness at the said rear edge portion of the patterned layer of material deposited from the cylinder roller 14 onto the substrate 12 can be substantially eliminated by rotating the two cylinder rollers 14 and 18 such that the tangential speed of the second cylinder roller 18 is about 2% to 5%, more particularly about 2.5% to 5%, greater than the tangential speed of the cylinder roller 14 during the process of transferring liquid from the second cylinder roller 18 to the mat 16. In this embodiment, the first cylinder roller 14 is operated at a tangential speed of about 20m/s and the second cylinder roller 18 is operated at a tangential speed of about 20.5m/s.

Returning again to FIG. 2, the third cylinder roller 20 functions to improve the uniformity of the coating of liquid 22 on the second cylinder roller 18.

In order to achieve the high levels of thickness uniformity described above, it may be necessary to first condition the mat 16 by performing one or more dummy runs involving the transfer of the said material from the second cylinder roller 18 onto the first cylinder roller 14 and then onto a substrate on stage 10, which substrate could be the same kind of substrate 12 as described above (which would afterwards be discarded or recycled), or a dummy substrate without the features necessary to produce a TFT array. The dummy runs can serve to remove undesirable particles from the mat 16, which particles could otherwise be a cause of poor uniformity of thickness in the deposited layers.

Examples of semiconductor materials for the semiconductor channels 7 include: polythiophenes such as poly 3-hexylthiophene (P3HT); poly 2,5-thienylene vinylene; poly p-phenylenevinylene (PPV); polyfluorene materials such as poly(9,9-dioctylfluorene, poly(9,9-dioctylfluorene-co-benzothiadiazole, poly(9,9-dialkylflourne-co-bithiophene, poly (9,9-dioctylfluorene-co-bis-N,N'-(4-butylphenyl)diphenylamine), poly(9,9-dioctylfluorene-co-bis-N,N'-(4-butylphenyl)-bis-N,N'-phenyl-1,4-phenylenediamine); polydiacetylene; pentacene and pentacene derivatives. Examples of dielectric materials for the gate dielectric elements 8 include polystyrene (PS), polyvinylphenols, polymethylmethacrylates (PMMA), Teflon® AF fluoropolymers available from Dupont, Cytop® fluoropolymers available from Asahi Glass Chemicals, SU-8 epoxy resins, poyisobutylenes, polynorbornenes, and PS-PMMA copolymers.

Figure 5:
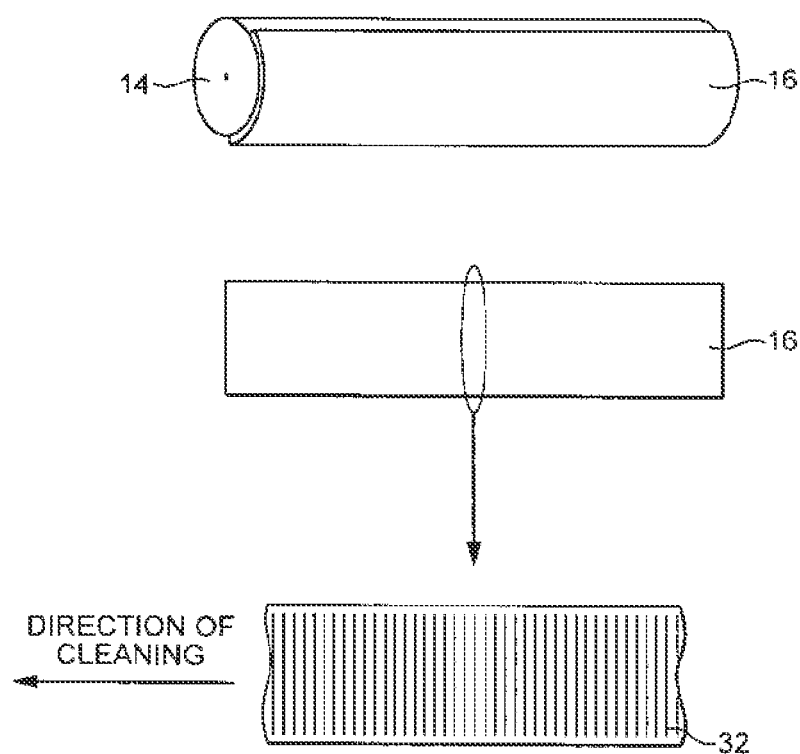
FIG. 5 illustrates an aspect of an embodiment of the present invention.

As mentioned above, the microrecesses 32 can take the form of an array of parallel microgrooves 32, as illustrated in FIG. 5. Cleaning of the mat comprises two wiping steps using different solvents, a first, relatively high boiling point solvent for the main cleaning, and a second, relatively low boiling point solvent for aiding drying of the mat. The first solvent has a higher boiling point that the second solvent.

Cleaning of the mat is done when the production process is to be stopped for a significant period of time, and when again resuming the production process. When resuming the production process after a significant period of rest time, it may be necessary to repeatedly load and discharge the mat 16 with the material to be deposited before the desired levels of high uniformity can again be achieved.

It has been found that cleaning is best achieved by passing the cleaning solvents over the mat in a direction perpendicular to the microgrooves 32. Cleaning of the mat is carried out manually passing a cleanroom cloth soaked in solvent in a direction perpendicular to the microgrooves 32. For example, at least three cleaning passes are done with the first high boiling point solvent followed by at least three cleaning passes with the low boiling point solvent.

The above-described technique can be used in combination with other deposition techniques. For example, it can be used to deposit an organic polymeric semiconductor layer and/or organic dielectric layer in a device including a gate dielectric layer or additional gate dielectric layer of a dielectric bilayer structure deposited by a vapour deposition technique.

In addition to any modifications explicitly mentioned above, it will be evident to a person skilled in the art that various other modifications of the described embodiment may be made within the scope of the invention.

The invention claimed is:

1. A method of producing one or more electronic switching devices, each switching device comprising a semiconductor channel between two electrodes, and a dielectric element separating said semiconductor channel from a switching electrode, the method comprising: depositing onto a substrate a layer of material for at least partly forming said semiconductor channel or said dielectric element of said one or more switching devices by transferring said material onto said substrate from a rotating first roller, comprising selectively depositing said material onto selected regions of said substrate to form a patterned layer in a single rotation of said first roller.

2. The method according to claim 1, wherein the layer deposited on the substrate exhibits a thickness non-uniformity of less than about 7%.

3. The method according to claim 1, wherein the thickness non-uniformity of said patterned layer over the combined area of said patterned layer is less than about 7%.

4. The method according to claim 1, wherein the substrate defines a plurality of patterned conductive layers in respective selected regions of the substrate, and said patterned layer of material provides a respective layer of said material over each of said patterned conductive layers.

5. The method according to claim 4, wherein each of said patterned conductive layers defines a respective array of source-drain electrode pairs for a respective array of transistors, or a respective array of gate lines for a respective array of transistors.

6. A method of producing one or more electronic switching devices, each switching device comprising a semiconductor channel between two electrodes, and a dielectric element separating said semiconductor channel from a switching electrode, the method comprising: depositing onto a substrate a layer of material for at least partly forming said semiconductor channel or said dielectric element of said one or more switching devices by transferring said material onto said substrate from a rotating first roller, further comprising applying said material to a second roller and transferring said material from said second roller to said first roller whilst rotating the first and second rollers, and controlling the tangential speed of the second roller such that the rear edge of said material transferred from said first roller onto the substrate has a thickness substantially no greater than the average thickness of the remainder of the layer deposited onto the substrate.

7. The method according to claim 6, comprising transferring said material from said second roller to said first roller whilst rotating the second roller at a greater tangential speed than said first roller.

8. The method according to claim 7, wherein the tangential speed of the second roller is between about 2% and about 5% greater than the tangential speed of the first roller.

9. A method of producing one or more electronic switching devices, each switching device comprising a semiconductor channel between two electrodes, and a dielectric element separating said semiconductor channel from a switching electrode, the method comprising: depositing onto a substrate a layer of material for at least partly forming said semiconductor channel or said dielectric element of said one or more switching devices by transferring said material onto said substrate from a rotating first roller, wherein the surface of the first roller defines a plurality of parallel grooves for receiving and holding said material; and further comprising cleaning the first roller by passing one or more cleaning solvents over the first roller in a direction perpendicular to said parallel grooves.

10. A method of producing one or more electronic switching devices, each switching device comprising a semiconductor channel between two electrodes, and a dielectric element separating said semiconductor channel from a switching electrode, the method comprising: depositing onto a substrate a layer of material for at least partly forming said semiconductor channel or said dielectric element of said one or more switching devices by transferring said material onto said substrate from a rotating first roller, wherein said first roller comprises a surface mat for receiving said material, and wherein said mat exhibits swelling by said material of no more than 30%.

11. A method of producing one or more electronic switching devices, each switching device comprising a semiconductor channel between two electrodes, and a dielectric element separating said semiconductor channel from a switching electrode, the method comprising: depositing onto a substrate a layer of material for at least partly forming said semiconductor channel or said dielectric element of said one or more switching devices by transferring said material onto said substrate from a rotating first roller, wherein said first roller comprises a surface mat for receiving said material; said material comprises a solvent; and said mat exhibits swelling by said solvent of no more than 30%.

* * * * *